US012795857B2

(12) United States Patent
Mazurkiewicz et al.

(10) Patent No.: US 12,795,857 B2
(45) Date of Patent: Nov. 10, 2026

(54) COOLING PLATE HAVING RECONFIGURABLE FERROFLUID-BASED CHANNELS

(71) Applicant: Amazon Technologies, Inc., Seattle, WA (US)

(72) Inventors: Paul H. Mazurkiewicz, Lake Forest Park, WA (US); Damian Philip Evans, Bellevue, WA (US)

(73) Assignee: Amazon Technologies, Inc., Seattle, WA (US)

( * ) Notice: Subject to any disclaimer, the term of this patent is extended or adjusted under 35 U.S.C. 154(b) by 272 days.

(21) Appl. No.: 18/622,544

(22) Filed: Mar. 29, 2024

(65) Prior Publication Data

US 2025/0311152 A1 Oct. 2, 2025

(51) Int. Cl.
*H05K 7/20* (2006.01)
*G06F 1/20* (2006.01)
*H10W 40/47* (2026.01)

(52) U.S. Cl.
CPC ........... *H05K 7/20272* (2013.01); *G06F 1/20* (2013.01); *H05K 7/20254* (2013.01); *H10W 40/47* (2026.01)

(58) Field of Classification Search
CPC .... F28D 15/00; F28D 2021/0019; F28F 3/06; F28F 13/16; G06F 1/206; H05K 7/20; H05K 7/20218; H05K 7/20254; H05K 7/20272; H10W 40/47
See application file for complete search history.

(56) References Cited

U.S. PATENT DOCUMENTS 6,408,884 B1 * 6/2002 Kamholz ............ F16K 99/0019 137/251.1
8,398,295 B2 * 3/2013 Yellen ..................... B03C 1/288 366/273
9,786,969 B2 * 10/2017 Masias .............. H01M 10/6556
2012/0275929 A1 * 11/2012 Salsman ................. F04B 43/04 417/322
2015/0257306 A1 * 9/2015 Glew ................. H05K 7/20281 165/104.28
2017/0220084 A1 * 8/2017 Wang ................. H05K 7/20327
(Continued)

OTHER PUBLICATIONS

PCT/US2025/021531, "International Search Report and Written Opinion", Jul. 1, 2025, 15 pages.

*Primary Examiner* — Jayprakash N Gandhi
*Assistant Examiner* — Jamil Alexander Decker
(74) *Attorney, Agent, or Firm* — Kilpatrick Townsend & Stockton LLP

(57) ABSTRACT

A system can include a cooling plate configured for dissipating heat from a processor or other heat-generating component. The cooling plate can include a body defining a coolant chamber having a coolant inlet and a coolant outlet. An amount of ferrofluid within the coolant chamber can be arrangeable to at least partially define one or more guides for coolant flow within the coolant chamber between the coolant inlet and the coolant outlet. A magnetic field emitter can be positioned relative to the body so as to be operable to alter an arrangement of the ferrofluid within the coolant chamber to adjust a physical characteristic (such as size, shape, and/or location) of at least one of the one or more guides for coolant flow within the coolant chamber between the coolant inlet and the coolant outlet.

20 Claims, 5 Drawing Sheets

(56) References Cited

U.S. PATENT DOCUMENTS

| | | | | |
|---|---|---|---|---|
| 2017/0303445 | A1 | 10/2017 | Robert et al. | |
| 2018/0087849 | A1* | 3/2018 | Lai | H04M 1/0202 |
| 2018/0352678 | A1* | 12/2018 | Adams | H10W 40/47 |

* cited by examiner

COOLING PLATE HAVING RECONFIGURABLE FERROFLUID-BASED CHANNELS

BACKGROUND

Computing systems can be subject to many factors that may impact performance. Many relevant factors can relate to mechanical aspects of the components that are utilized in computing systems. Some mechanical considerations can relate to dissipation of heat that may be generated from one or more chips, a set of dice (which may include one die or more than one dice or dies), or other heat-generating components in use. Other considerations can include size limitations. Even minor changes to accommodate and balance among such considerations may render cost savings and/or operational performance benefits that may be significant or non-negligible, especially when implemented across large scale production volumes typical with manufacture of components for computing systems.

BRIEF DESCRIPTION OF THE DRAWINGS

Various embodiments in accordance with the present disclosure will be described with reference to the drawings, in which.

DETAILED DESCRIPTION

Embodiments herein relate to computing component systems, such as may be provided with a cooling plate having a coolant chamber with flow paths that can be modified by guides that are constructed by ferrofluid materials. The ferrofluid materials can be acted upon by magnetic fields to adjust an arrangement of the ferrofluid materials in order to change a flow path layout of conduits, channels, or other guides for controlling fluid flow characteristics through the coolant chamber in use. Accordingly, coolant flow layouts may be adjusted by adjusting the magnetic field to change ferrofluid placement and/or arrangement within the chamber.

Adjusting ferrofluid location within the chamber can allow particular channels to be expanded, contracted, repositioned, reshaped, or otherwise adjusted to provide suitable flow characteristics within the chamber. For example, to provide tailored and/or enhanced cooling, the chamber in a first configuration may be adjusted to exhibit a flow profile that focuses flow over a hotspot in a first zone on a processor or other heat-generating component, and the chamber in a second configuration may be adjusted to exhibit a different flow profile that focuses flow over a second zone of the heat-generating component that may have a higher amount of heat generated during a different operating mode of the heat-generating component.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
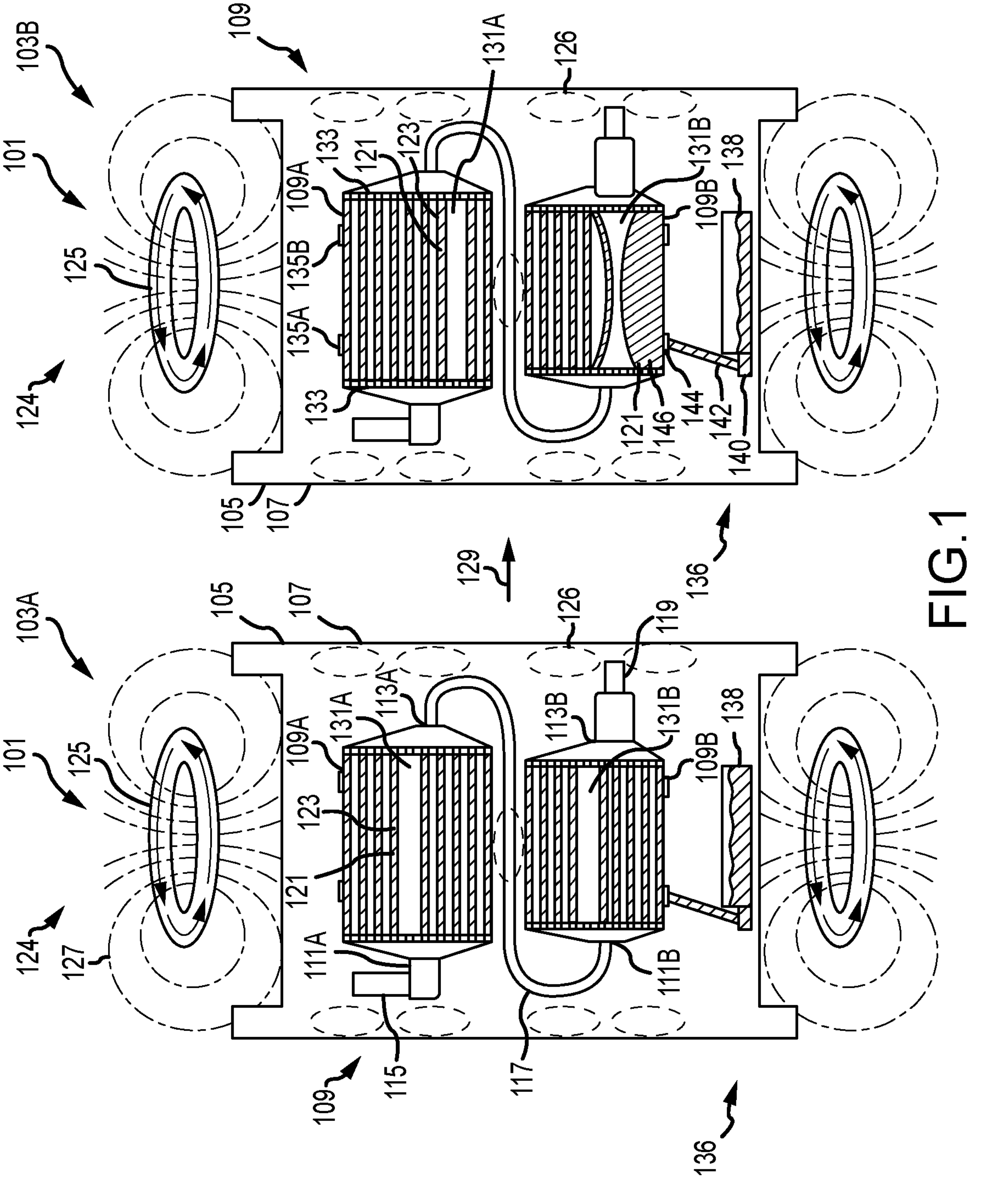
FIG. 1 illustrates a system that may include ferrofluid for defining guides of flow paths within a coolant chamber in accordance with various embodiments.

FIG. 1 illustrates two instances of a system 101 in differing configurations. For example, a first configuration 103A is shown at left in FIG. 1 and a second configuration 103B is shown at right in FIG. 1.

The system 101 can include a cooling plate 105. The cooling plate 105 can be configured for dissipating heat, for example. The cooling plate 105 can include a body 107. The body 107 may be formed of aluminum or other suitable material with appropriate characteristics for functions described herein. For example, the cooling plate 105 may be constructed of material with suitable heat transfer characteristics, material that may be sufficiently robust for load-bearing, and/or material that may be suitable for machining to provide a suitable structure for purposes described herein.

The body 107 can include at least one chamber 109. In FIG. 1, examples of the chamber 109 are individually identified as a first chamber 109A and a second chamber 109B. Although two chambers 109 are shown in FIG. 1, any suitable number of chambers 109 can be utilized. Any chamber 109 may be a coolant chamber, for example.

The coolant chamber 109 can define a coolant inlet 111 and a coolant outlet 113. Examples of the coolant inlet 111 and the coolant outlet 113 are denoted with respective suffixes in FIG. 1, such as a first coolant inlet 111A, a second coolant inlet 111B, a first coolant outlet 113A, and a second coolant outlet 113B. Any coolant inlet 111 may be coupled with a suitable input for receiving water or other coolant, for example. The coolant inlet 111 may be coupled with an inlet fitting 115. The inlet fitting 115 may provide a suitable interface for enabling flow from a coolant supply (such as a water supply) and into the coolant inlet 111. In the embodiment shown in FIG. 1, the inlet fitting 115 is shown coupled with the first coolant inlet 111A of the first chamber 109A, while the first coolant outlet 113A is coupled with a hose 117 that provides fluid flow from the first chamber 109A into the second chamber 109B. In the depicted example, the hose 117 is shown providing fluid flow from the first coolant outlet 113A of the first chamber 109A and carrying flow to the second coolant inlet 111B of the second chamber 109B. Fluid can flow through the second chamber 109B in the depicted embodiment to the second coolant outlet 113B, which is also shown coupled with an outlet fitting 119.

More generally, the inlet fitting 115 and the outlet fitting 119 may be coupled to a single chamber 109 in operation or at differing ends of a series of chambers 109, which may be connected by the hose 117 or any other suitable structure to permit flow of coolant through the system 101. For example, although the hose 117 is depicted as a flexible tube, the hose 117 may additionally or alternatively correspond to or be replaced with a channel or other conduit structure that may be machined, coupled, or otherwise incorporated into and/or with the cooling plate 105. Moreover, although the cooling plate 105 is depicted as rectangular in shape in FIG. 1, any other suitable shape may be utilized.

The chamber 109 may be supplied with an amount, quantity, or mass of ferrofluid 121. The ferrofluid 121 may be utilized to define one or more guides 123. The guides 123 may guide coolant flow within the chamber 109 in use. For example, the guides 123 may direct coolant flow movement between the coolant inlet 111 and the coolant outlet 113 of a respective chamber 109.

The ferrofluid 121 may correspond to any suitable magnetic material suspended in a carrier substance fluid, such as a liquid. Water-based or oil-based solutions may be utilized. A water-based carrier substance for the ferrofluid 121 may be most suitable for situations in which a coolant utilized is not also water-based. Since water-based coolant (e.g., plain water or water with additives for biocide, anti-corrosion, or other purposes) may be prevalent to implement (e.g., due to simplicity and/or ready availability of materials), oil-based carrier substances (e.g., rather than water-based) may be implemented in many embodiments. In various embodiments, the ferrofluid 121 may include an oil or carrier substance that is hydrophobic. Including a hydrophobic carrier substance may facilitate a distinct separation between the ferrofluid 121 and water (or other coolant) in the system. In some embodiments, a water-based ferrofluid 121 may be utilized with an oil-based coolant. More generally, materials may be selected so that a base substance of coolant and a carrier substance of a ferrofluid will be immiscible, which may allow the ferrofluid 121 and the coolant to maintain distinct separation in use. A distinct separation may facilitate the ferrofluid 121 acting as a guide for the coolant without mixing with the coolant, for example.

Examples of magnetic particles that may be included in the ferrofluid 121 may include ferromagnetic particles or ferrimagnetic particles. Some examples of substances that may be suitable for particles in the ferrofluid 121 may include pure forms, alloys, or compounds of iron, cobalt, nickel, and certain rare-earth metals. Overall, the "ferro" prefix in ferrofluid 121 need not necessarily necessitate that ferrous or iron particles be present in the ferrofluid but may refer to the ferrofluid 121 exhibiting ferromagnetic and/or ferrimagnetic behavior and/or properties (e.g., regardless of whether or not ferrous or iron materials are included). The particles may be nanoparticles (e.g., which may remain suspended within the carrier substance), whereas particles of a micrometer scale (e.g., which may be suitable for use in a magnetorheological fluid) may settle over time.

In some examples, the carrier substance can further include oleic acid, tetramethylammonium hydroxide, citric acid, soy lecithin, or other suitable surfactant, which may contribute to preventing magnetic particles from adhering together into heavier clusters that could precipitate out of the ferrofluid solution.

Generally, the ferrofluid 121 may be responsive to magnetic fields to change arrangements of the ferrofluid 121. For example, in response to one magnetic field, the ferrofluid 121 may align magnetic particles of the ferrofluid 121 to a first arrangement or configuration. Then, in response to a change of field, the ferrofluid 121 may align magnetic particles of the ferrofluid 121 to a second arrangement or configuration.

The system 101 may further include or be implemented relative to a set 124 of one or more magnetic field emitters 125. Each magnetic field emitter 125 may correspond to a structure suitable for or capable of emitting magnetic fields 127. The magnetic field emitter 125 may be controllable to alter a magnetic field 127 supplied. Some examples may include an electromagnetic that can be controlled to alter a supplied magnetic field 127. In some embodiments, one or more permanent magnets (e.g., movable or static) may be utilized and/or supplemented with electromagnets. Any other form of electromagnet, permanent magnets, or other form of magnetic field emitters can be utilized.

Magnetic field emitters 125 herein may correspond to magnets. Magnets may correspond to any structure capable of providing a magnetic field 127. The magnetic field emitters 125 may alter magnetic fields 127 which may extend into and/or through the chamber 109. For example, the magnetic field emitters 125 may be positioned relative to the body 107 so as to be operable to alter placement and/or arrangement of the ferrofluid 121 in the chamber 109.

In some embodiments, different magnetic fields 127 from different magnetic field emitters 125 in the set 124 may interact with one another (such as to provide constructive or destructive interference and/or other modulation of magnetic fields 127) to control arrangement of the ferrofluid 121 along particular locations, lines, and/or paths within the chamber 109. Although two magnetic field emitters 125 remote from and at opposite sides of the cooling plate 105 are shown in solid lines in FIG. 1, any number and/or positioning on and/or adjacent cooling plate 105 may be utilized. Some examples of alternate locations 126 that may include magnetic field emitters 125 are depicted by dashed line ovals in FIG. 1 (which may include on differing sides of a given chamber 109, laterally offset from a given chamber 109, vertical offset from a given chamber 109, and/or between multiple chambers 109), although any combination of suitable numbers and/or positioning of magnetic field emitters 125 can be included.

Altering the arrangement of the ferrofluid 121 within the chamber 109 may adjust a physical characteristic of at least one of the guides 123 within the chamber 109. Examples of physical characteristics may be location, shape, and/or size. As one example, as depicted in FIG. 1, as the magnetic field emitters 125 transition from a first operational state to a second operational state (such as depicted by arrow 129 and corresponding to shifting from the first configuration 103A shown at left in FIG. 1 to the second configuration 103B shown at right in FIG. 1), the guides 123 may shift the location of a first channel 131A bounded by the guides 123 defined by the ferrofluid 121. This may correspond to relocating a first channel 131A in the first chamber 109A within or among other channels formed by the ferrofluid 121. For example, the first channel 131A may move from a location (e.g., shown in the first configuration 103A) in which three other channels are one side and four other channels are on another side and may move to a different location (e.g., shown in the second configuration 103B) in which six other channels are on one side and one other channel is on another side. The other channels may provide respectively smaller flow paths than the first channel 131A, for example.

Other examples of changes in physical characteristics are shown with respect to a second channel 131B. The second channel 131B may be changed in shape in addition to being changed in location. For example, the guides 123 may be straight (e.g., as shown for the second channel 131B in the first configuration 103A) or curved (e.g., as shown for the second channel 131B in the second configuration 103B) or may be adjusted to exhibit any other suitable geometry (which may include, but is not limited to, at least partially straight, at least partially non-straight, diverging, or converging). In some embodiments, utilizing curved guides 123 can provide a nozzle effect to accelerate speed of coolant flowing through a restriction of the nozzle relative to parts of the chamber 109 at which restriction of the nozzle is not present.

The size of the second channel 131B is also shown as being altered with the shape and location, although any one of shape, location, or size may be altered independently. A change in size may correspond to a maximum dimension, a minimum dimension, or other comparable reference dimension that may be compared between different configurations. For example, a largest dimension (e.g., along opposite ends) is shown smaller for the second channel 131B in the first configuration 103A than in the second configuration 103B, and the smallest dimension (e.g., in a middle portion) is shown larger for the second channel 131B in the first configuration 103A than in the second configuration 103B.

In some examples, a magnetic field 127 from the magnetic field emitter 125 may be sufficient to maintain ferrofluid 121 within the chamber 109 notwithstanding flow of coolant through the chamber 109. The chamber 109 may include one or more barriers 133 which may be positioned to contain ferrofluid 121 within the chamber 109 independent of a presence of a magnetic field 127 (such as if the magnetic field emitters 125 are shut off or cease providing a predictable magnetic field 127 in use). The barriers 133 may correspond to membranes or other structures with apertures or orifices that are sized to be large enough to allow molecules of water or other coolant to pass through and small enough to prevent particles of the ferrofluid 121 from passing through. More generally, the barriers 133 may be arranged to prevent passage of the ferrofluid 121 through the coolant outlet 113 and/or the coolant inlet 111 of a given chamber 109.

In some aspects, sizing and/or positioning of channels 131 in the second chamber 109B may be modulated to account for heat absorbed in the first chamber 109A prior to reaching the second chamber 109B. For example, a wider second channel 131B may be utilized in the second chamber 109B than a first channel 131A utilized in the first chamber 109A.

Also shown in FIG. 1 are an introduction port 135A and an escape port 135B. For example, the ferrofluid 121 may be introduced so as to be received within the chamber 109 through the introduction port 135A. Air may escape through the escape port 135B in response to receiving the ferrofluid 121 through the introduction port 135A. Once a suitable amount of ferrofluid 121 has been introduced into the chamber 109, the chamber 109 may undergo sealing of the introduction port 135A and the escape port 135B. Sealing may be achieved by readily reversible techniques to allow subsequent introduction of ferrofluid 1214 and/or extraction of ferrofluid 121 if desired. Alternatively, the ports 135 may be sealed by brazing, soldering, or other suitable sealing techniques.

In some embodiments, a ferrofluid supply system 136 may be included. The ferrofluid supply system 136 may include suitable components to alter (e.g., increase or decrease) an amount of ferrofluid 121 present in the chamber 109. For simplicity, examples of components of the ferrofluid supply system 136 are shown relative to the second chamber 109B but may be implemented additionally or alternatively relative to the first chamber 109A and/or any arrangement of one or more chambers 109.

The ferrofluid supply system 136 is shown with a reservoir 138, pump 140, a conduit 142, and a valve 144, although fewer, more, or different combinations of any of these and/or other components may be utilized. The reservoir 138 may be sized and arranged to contain ferrofluid 121 separately from the chamber 109. Suitable structure may be included for transferring ferrofluid 121 between the reservoir 138 and the chamber 109. For example, the conduit 142 may provide a path between the reservoir 138 and the chamber 109. The pump 140 may drive ferrofluid 121 from the reservoir 138 into the chamber 109 to increase an amount of ferrofluid 121 in the chamber 109 and/or may drive ferrofluid 121 from the chamber 109 into the reservoir 138 to decrease an amount of ferrofluid 121 in the chamber 109. Additionally or alternatively, the valve 144 may be suitably positioned to block, allow, or otherwise control flow of ferrofluid 121 relative the reservoir 138 and/or the chamber 109. In some embodiments, one or more magnetic field emitters 125 in the set 124 may be operable to drive ferrofluid 121 relative to the chamber 109 and/or reservoir 138 in lieu of and/or as a supplement to the pump 140 and/or the valve 144.

The valve 144 is shown at an end of the conduit 142 and along a boundary of the chamber 109 (e.g., in a location that may be suitable for blocking inadvertent passage of ferrofluid 121 across a boundary of the chamber 109), although any suitable location for controlling flow relative the reservoir 138 and/or the chamber 109 may be utilized. In some embodiments, the conduit 142 or other structure of the ferrofluid supply system 136 may be coupled with an inlet or outlet previously used for initially charging the chamber 109 with ferrofluid 121 (such as the introduction port 135A and/or the escape port 135B).

Differing levels or amounts of ferrofluid 121 may be useful for addressing different conditions. Ferrofluid 121 may be provided in suitable quantity to occupy between 25% and 75% (or other amount or range) relative to a total volume of the chamber 109, for example. Generally, including the ferrofluid supply system 136 may facilitate changing how much ferrofluid 121 (e.g., by total quantity or volumetric ratio) is present in the chamber 109 to accommodate different situations. Reducing an amount of ferrofluid 121 in the reservoir 138 may increase an amount of ferrofluid 121 in the chamber 109 or vice versa. As an illustrative example shown in FIG. 1, changing between the first configuration 103A to the second configuration 103B (as depicted by arrow 129) may include some ferrofluid 121 that was in the reservoir 138 in the first configuration 103A being moved into the chamber 109 in the second configuration 103B, such as to form a block 146 of ferrofluid 121 in the chamber 109. Block 146 also further illustrates by way of example that ferrofluid 121 may be arranged to occupy any area of any desired shape in use.

Figure 2:
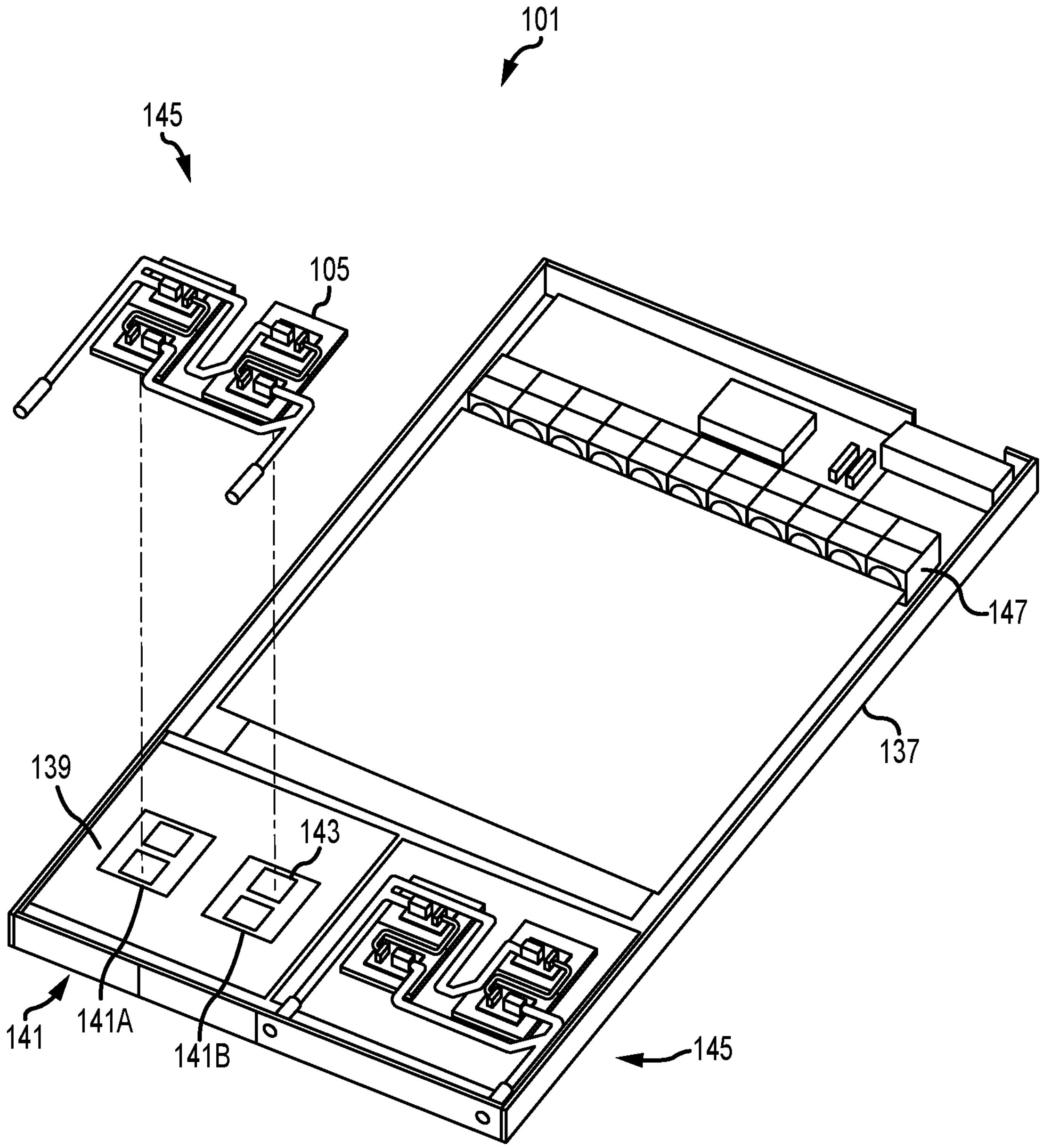
FIG. 2 illustrates a perspective view of the system of FIG. 1 implemented relative to other components, such as within a computing system, in accordance with various embodiments.

FIG. 2 illustrates a perspective view of the system 101 implemented with respect relative to other components, such as within a computing system. For example the system 101 may include components suitable for including servers, routers, network switches, or other network computing devices.

The system 101 in FIG. 2 is shown with a chassis 137. The chassis 137 may be formed of sheet-metal or any other suitable structure. In some examples, the chassis 103 may be slidable in and/or out of a rack, such as a server rack.

The chassis 137 can include a board 139. The board 139 may correspond to a motherboard and/or other suitable board for receiving and/or interfacing with other elements of the system 101. The board 139 may define at least one socket zone 141, for example. FIG. 2 shows a first socket zone 141A and second socket zone 141B, although any number of one, two, or more socket zones 141 may be utilized. As an illustrative example, the system 101 may be or may correspond to a two-socket server, although features of system 101 may be implemented in three-socket, four-socket, or n-socket varieties of servers or other computing devices.

Each socket zone 141 may correspond to a region in which a heat-generating component 143 may be situated and/or installed in use. For example, although each socket zone 141 is shown with two heat-generating components 143, any suitable combination of one, two, or other numbers may be utilized. The heat-generating components 143 may correspond to integrated circuits (including chips or dice), or other heat-generating components. Non-limiting examples include a processor, an input/output (I/O) chip, a baseboard management controller, a chip, a die, a card (e.g., which may include a printed circuit board various that bears other components), a voltage regulator, a hot swap control, an inductor, a resistor, or a capacitor). Other non-limiting examples may include a Field Programmable Gate Array (FPGA), a Complex Programmable Logic Device (CPLD), and a System-on-a-Chip (SoC). Each heat-generating component 143 may include one or more subcomponents that generate heat. In some examples, the heat-generating components 143 may include a first processor and a second processor, although the heat-generating components 143 may be of similar or different types of components relative to each other.

A heat dissipation system 145 may be included relative to the heat-generating components 143. The heat dissipation system 145 may include one or more instances of the cooling plate 105 described with respect to FIG. 1. Although two instances of the heat dissipation system 145 are shown in FIG. 2 (e.g. with one installed in the rightward portion of FIG. 2 and one shown in an upwardly exploded position to show components thereunder at left in FIG. 2), any number of subcomponents and/or collections of components of the heat dissipating system 145 may be implemented in use.

Other components may be included in the system 101, such as fans 147. Elements of the fans 147 or other elements of the heat dissipation system 145 may be controlled independently and/or collectively within the system 101.

Figure 3:
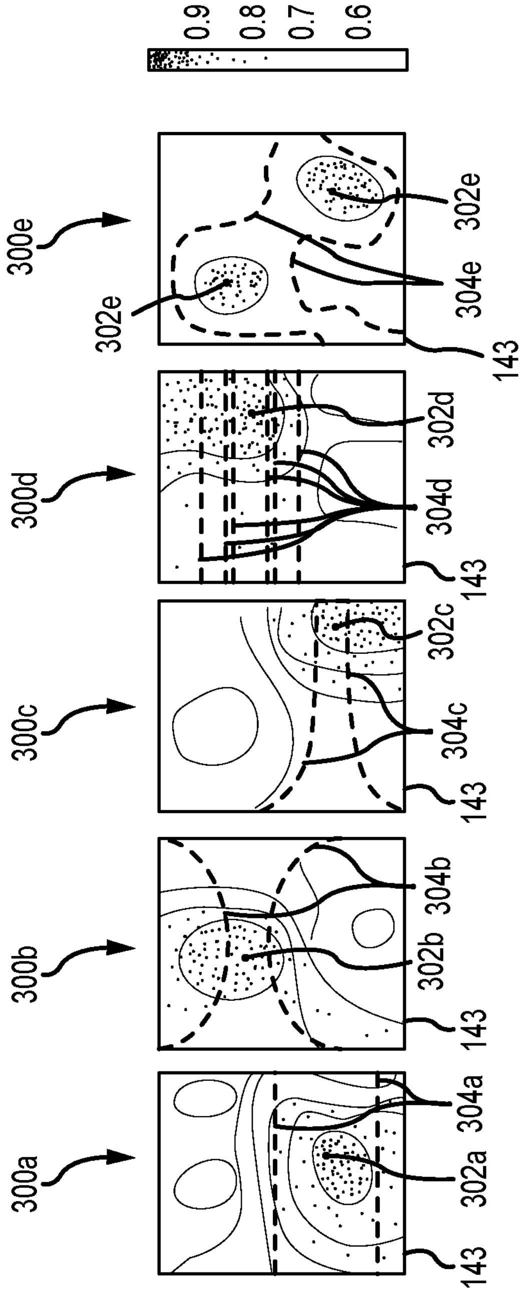
FIG. 3 illustrates a series of thermal images representing examples of heat distributions that may be addressed by the system of FIG. 1 in accordance with various embodiments.

FIG. 3 illustrates a series of thermal images representing examples of heat distributions that may occur on or more of the heat-generating components 143. The images may correspond to different modes 300*a*, 300*b*, 300*c*, 300*d*, and 300*e* of operation of the heat-generating component 143, for example. The images may correspond to heat maps, e.g., which may utilize different intensities of visual indicia to represent different levels of heat in operation. For example, the scale at right in FIG. 3 presents a scale differentiated by density of stippling, where higher density of stippling may correspond to higher temperature.

Heat may be distributed unevenly within and/or between each of the modes 300*a-e*. For example, heat may be distributed in higher concentrations at and/or around hotspots 302*a-e* that may be present in each of the modes 300*a-e*. A hotspot 302 may emerge in a different location with respect to a heat-generating component 143 based on a type of process being performed by the heat-generating component 143 in a given mode 300*a-e*. For example, different types of processes may involve subcomponents located in different regions of the heat-generating component 143 and may thereby generate greater amounts of heat in different regions of the heat-generating component 143 during different modes 300*a-e*. As an illustrative example, mode 300*a* may correspond to a processor executing a large language model or other artificial intelligence (AI) program that primarily makes use of a lower portion of the heat-generating component 143, whereas mode 300*b* may be a different processor executing a database application that primarily makes use of an upper portion of the same or a different heat-generating component 143. Accordingly, the hotspots 302*a* and 302*b* may correspond to physical locations on the heat-generating component 143 that may be generating the most heat and/or may have the highest temperatures.

To address, mitigate, and/or prevent a hotspot 302, coolant flow may be focused relative to the hotspot 302. For example, with respect to features identified in FIG. 1, the system 101 can magnetically manipulate the ferrofluid 121 to adjust a physical characteristic (e.g., location, size, shape, and/or other physical characteristic) of one or more guides 123 to alter a coolant flow profile. To avoid obscuring other features in FIG. 3, dashed lines are utilized to show some generalized examples of different forms of layouts that may be implemented relative to hotspots 302*a-e*. The dashed lines may represent channel boundaries 304*a-e*, which may correspond to guides 123 and/or ferrofluid 121 referenced in FIG. 1, for example. The depicted channel boundaries 304*a-e* may correspond to a set of one or more largest channels implemented in a given instance, and other smaller channels (e.g., similar to in FIG. 1) may be implemented supplementally even though omitted from view in FIG. 3 for clarity or may be omitted altogether depending on flow profiles desired. In some examples, portions or all of spaces outside channel boundaries 304*a-e* of the largest channel implemented may be partially or completely occupied by ferrofluid 121 in use.

Generally, channel boundaries 304*a-e* may be respectively implemented in suitable locations, sizes, and/or shapes to impact coolant flow over and/or near the hotspots 302*a-e* to enhance cooling provided at and/or near the hotspot 302. Although FIG. 3 for simplicity primarily shows channel boundaries 304*a-e* arranged to define channels that pass over hotspots 302*a-e*, channels additionally or alternatively may be arranged over other areas or zones. For example, channels may be arranged to control flow so that relatively higher flow (and thus greater cooling) is provided along hotspots 302*a-e* (or other areas that produce a relatively higher thermal load) and so that relatively lower flow (and thus lesser cooling) passes along different areas that produce a relatively lower thermal load, e.g., such that high cooling is prioritized to zones with high thermal load and commensurate lower cooling is supplied to areas with lower demand for cooling.

Thus, the images in FIG. 3 may correspond to an illustrative example that includes a processor, chip, or other heat-generating component that may have a plurality of zones that include at least a first zone (e.g., at and/or around hotspot 302*a*) and a second zone (e.g., at and/or around hotspot 302*b*) that exhibit different heat-producing characteristics during different modes of operation (e.g., modes 300*a* and 300*b*) of the chip processor, chip, or other heat-generating component. Ferrofluid may be arranged in different arrangements, such as those depicted by channel boundaries 304*a* and 304*b*. For example, the ferrofluid in the first arrangement may be arranged to form a first set of walls (e.g., channel boundaries 304*a*) defining a first set of coolant flow paths through the coolant chamber that facilitate a greater amount of coolant flow along the first zone (e.g., at and/or around a location of hotspot 302*a*) than along the second zone (e.g., at and/or around a location that may later have hotspot 302*b*). Continuing this example, the ferrofluid in the second arrangement may be arranged to form a different, second set of walls (e.g., channel boundaries 304*b*) defining a different, second set of coolant flow paths through the coolant chamber that facilitate a greater amount of coolant flow along the second zone (e.g., at and/or around a location of hotspot 302*b*) than along the first zone (e.g., at and/or around a location that may have previously included hotspot 302*b*). Leveraging this capability of the ferrofluid, one or more magnetic field emitters 125 (e.g., FIG. 1) may be operable to alter placement of the ferrofluid within the coolant chamber to shift between the first arrangement and the second arrangement so as to arrange the ferrofluid in the first arrangement (e.g., along channel boundaries 304*a*) to facilitate the greater amount of coolant flow along the first zone (e.g., at or along the hotspot 302*a*) when the processor, chip, or other heat-generating component is in the first mode (e.g., mode 300*a*) having the higher heat load in the first zone and so as to arrange the ferrofluid in the second arrangement (e.g., along channel boundaries 304*b*) to facilitate the greater amount of coolant flow along the second zone (e.g., at or along the hotspot 302*b*) when the processor, chip, or other heat-generating component is in the second mode (e.g., mode 300*b*) having the higher heat load in the second zone.

Any suitable form factor may be utilized. Channel boundaries 304*a* and 304*d* show examples of straight edges. Where channel boundaries 304*a* show an example of forming a single large channel across the hotspot 302*a*, the channel boundaries 304*d* show an example of forming a central channel and multiple peripheral channels. Channel boundaries 304*b*,304*c*, and 304*e* show examples with curved or otherwise non-straight edges. In some embodiments, curved edges (such as channel boundaries 304*b* and/or 304*c*) may be curved toward one another or otherwise suitably arranged to form a nozzle shape, e.g., which may include a narrowing restriction that operates to accelerate fluid flow passing through the restriction. In this manner, the channels may be utilized to increase speed of flow at a target location. Flaring out from the restriction may be included on both sides (such as with channel boundaries 304*b*) or on a single side (such as with channel boundaries 304*c*). Channel boundaries 304*e* show an example in which flow is modulated to flow across multiple hot spots 302*e*. Multiple hotspots may occur in arrangements that include a Field Programmable Gate Arrays (FPGA), a Complex Programmable Logic Device (CPLD), a System-on-a-Chip (SoC), and/or in other arrangements with multiple types and/or zones of heat-generating components, for example. Overall, any simple or complex flow geometry may be implemented with the ferrofluid 121, including geometries to facilitate and/or direct flow in left and/or rightward directions, in forward and/or backward directions, in up and/or down directions, in diagonal directions, in spiral directions, around and/or along an island and/or edge formed of ferrofluid 121, and/or in other flow arrangements.

Figure 4:
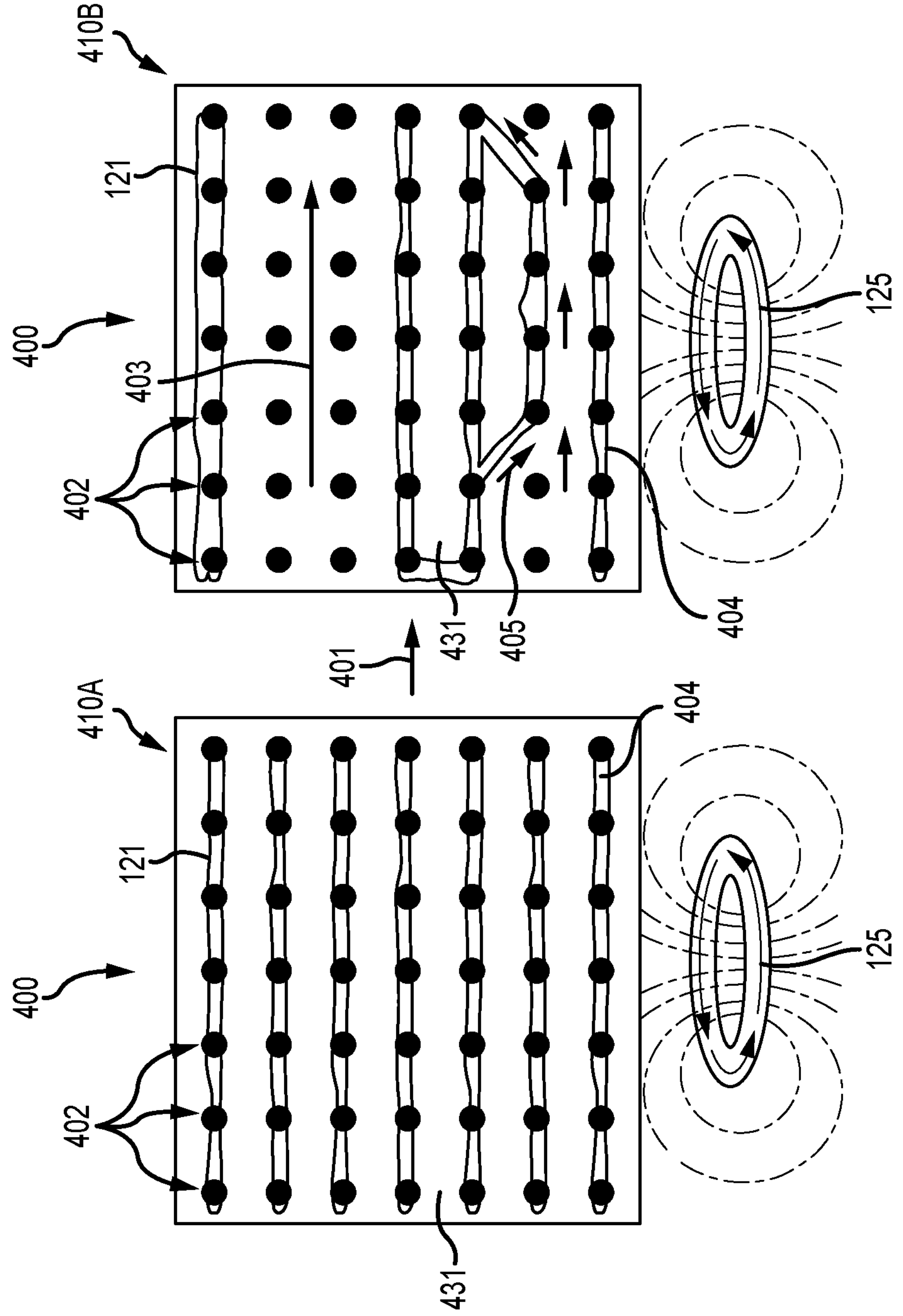
FIG. 4 illustrates a series of fixed anchors that can be implemented in the system of FIG. 1 in accordance with various embodiments.

FIG. 4 illustrates a series of fixed anchors 402 that can receive ferrofluid 121 according to certain aspects of the present disclosure. The fixed anchors 402 may be implemented in a coolant chamber 400, which may be an example of the coolant chamber 109. The fixed anchors 402 may be separated by gaps that can be filled or vacated by the ferrofluid 121 to adjust arrangement of coolant flow path boundaries 404 (which may correspond to guides 123, e.g., FIG. 1). The fixed anchors 402 are depicted as cylindrical protrusions but may correspond to projections of square, rectangular, elongate, or any other suitable form factor. The fixed anchors 402 may extend and/or span a full or partial height of the coolant chamber 400 (e.g., in a direction into or out of the page of the view of FIG. 4). The fixed anchors 402 can be fixed in a predetermined plan within the coolant chamber 400 (e.g., a grid-like plan, a repeating plan, or a plan that includes portions that are non-symmetric and/or non-repeating relative to other portions). The fixed anchors 402 may receive ferrofluid 121 such that the fixed anchors 402 and the ferrofluid 121 together define coolant flow path boundaries 404 within the coolant chamber 400. For example, the ferrofluid 121 may be arranged to extend laterally between any pair of respective sequentially adjacent fixed anchors 402 and/or vertically (e.g., above and/or below, such as in a direction into or out of the page of the view of FIG. 4) and/or horizontally (e.g., laterally, such as in a direction in a plane of the page of the view of FIG. 4) relative to any individual fixe anchor 402.

A magnetic field may be applied to the coolant chamber 400 (e.g., via one or more magnetic field emitters 125) such that the ferrofluid 121 relocates among differing arrangements. Relocating the ferrofluid 121 from the first configuration 410*a* to the second configuration 410*b* (such as illustrated by arrow 401) may create different coolant flow paths and may increase or alter an amount of cooling supplied in a location of the coolant chamber 400. For example, the ferrofluid 121 may adhere to the fixed anchors 402 in a first configuration 410*a* to form six even coolant flow paths and may adhere to the fixed anchors 402 in a second configuration 410*b* such that the ferrofluid 121 and fixed anchors 402 form two uneven current flow paths. As a result, a relatively higher amount of coolant flow may be provided along the expanded upper channel (such as depicted by arrow 403) while a relatively smaller amount of coolant flow may be provided along the lower channel (such as depicted by arrows 405). Flow through the lower channel may be accelerated by the nozzle shape imparted (such as depicted by arrows 405), for example. Flow may be modulated within the coolant chamber 400 by altering a channel size to affect an amount of flow and/or by adjusting a shape to affect a speed of flow.

In some examples, the fixed anchors 402 may have certain electrostatic properties that enable the ferrofluid to adhere to the fixed anchors 402. For example, an electrical attraction between the fixed anchors 402 and the ferrofluid may enable the creation of more predictably shaped coolant flow path boundaries 404 and may thereby provide additional control of a size, location, and/or shape associated with each coolant flow path. More generally, the fixed anchors 402 may be configured to provide at least a mild attraction to the ferrofluid 121 (such as by including material with magnetic properties or otherwise including a coating to attract material in the ferrofluid 121), which may cause the ferrofluid 121 to be predisposed to adhere to, couple with, or otherwise remain in a predictable arrangement relative the fixed anchors 402 absent magnetic fields in suitable strength and/or arrangement to overcome the effect of the fixed anchor and re-arrange the ferrofluid 121.

In some embodiments, ferrofluid 121 initially situated among one set of fixed anchors 402 may be relocated to be aggregated among other fixed anchors 402. For example, in FIG. 3, the ferrofluid 121 in the uppermost row in the second configuration 410*b* is depicted thicker than in the first configuration 410*a*, which may correspond to aggregating the ferrofluid 121 from the second and third row during the transition. In some embodiments, ferrofluid 121 may be moved to block or unblock a channel. As an example in FIG. 3, the left end of the channel 431 is shown blocked by ferrofluid 121 in the second configuration 410*b* and unblocked by the ferrofluid in the first configuration 410*a*. The channel 431 may be closed by moving from the first configuration 410*a* to the second configuration 410*b* and/or may be opened by moving to the first configuration 410*a* from the second configuration 410*b*. Although blocking, unblocking, closing, and opening are discussed with respect to the coolant chamber 400 with fixed anchors 402 in FIG.

4, such manipulations may be performed in the chamber 109 of FIG. 1 or other chamber in which fixed anchors 402 are not present.

Figure 5:
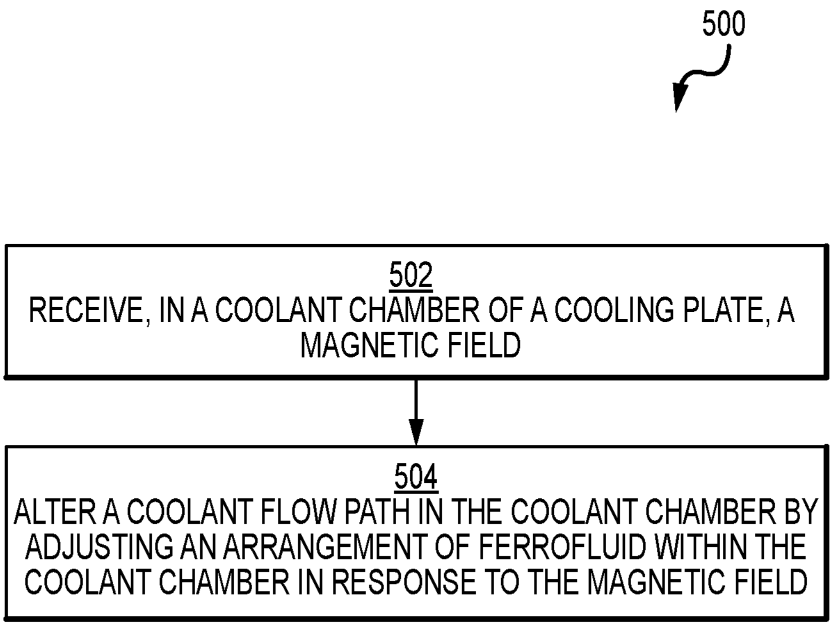
FIG. 5 is a flow chart depicting a process that may be performed with respect to a coolant chamber of the system of FIG. 1 in accordance with various embodiments.

FIG. 5 is a flow chart depicting a process 500 that may be performed relative to a coolant chamber (such as a coolant chamber discussed herein). Some or all of the process 500 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

At operation 502, the process 500 can include receiving, in a coolant chamber of a cooling plate, a magnetic field. This may correspond to applying a magnetic field to a coolant chamber of a cooling plate. The magnetic field may be from a magnetic field emitter 125, for example.

At operation 504, the process 500 can include altering a coolant flow path in the coolant chamber by adjusting an arrangement of ferrofluid within the coolant chamber in response to (e.g., using) the magnetic field. This may involve the chamber 109, ferrofluid 121, and/or other components discussed herein. Altering the coolant flow path may include changing a shape of the coolant flow path, a location of the coolant flow path, and/or a size of the coolant flow path (such as discussed with respect to the second channel 131B in FIG. 1). Additionally or alternatively, altering the coolant flow path may include closing or blocking the coolant flow path (such as discussed with respect to channel 431 in FIG. 4). Additionally or alternatively, altering the coolant flow path may include opening or unblocking the coolant flow path (such as discussed with respect to channel 431 in FIG. 4).

In some embodiments, the operation 504 includes adjusting the ferrofluid within the coolant chamber into a first arrangement of ferrofluid in the coolant chamber in response to the magnetic field (which may be a first magnetic field) to define a first flow path layout within the coolant chamber. The first Configuration 103A in FIG. 1 may be an example. The process 500 may further include receiving, in the coolant chamber of the cooling plate, a second magnetic field and adjusting the ferrofluid within the coolant chamber into a second arrangement of ferrofluid in the coolant chamber in response to the second magnetic field to define a second flow path layout within the coolant chamber. The second configuration 103B in FIG. 1 may be an example.

In some examples, the adjusting of the ferrofluid at operation 504 may be performed at any suitable time. For example, the ferrofluid may be adjusted before the heat-generating component begins an operation and/or during operation of the heat-generating component.

In some embodiments, prior to the receiving of the magnetic field, the process 500 may include installing the ferrofluid. For example, this may be accomplished by a subprocess that includes receiving an amount of ferrofluid through an introduction port into the coolant chamber (such as via the introduction port 135A in FIG. 1). The subprocess may further include permitting air to escape from the coolant chamber through an air escape port in response to the receiving of the amount of ferrofluid through the introduction port (such as via the escape port 135B in FIG. 1). The subprocess may further include undergoing sealing of the introduction port and the air escape port.

In some embodiments, the process 500 further includes receiving coolant flow through an inlet (such as the coolant inlet 111 in FIG. 1), through a flow pattern defined by ferrofluid (such as ferrofluid 121 in chamber 109 in FIG. 1), and through an outlet (such as through the coolant outlet 113 in FIG. 1). The coolant may be flowed through a barrier between the inlet and the flow pattern defined by the ferrofluid (e.g., through a barrier 133 at left of the chamber 109 in FIG. 1) and/or through a barrier between the flow pattern defined by the ferrofluid and the outlet (e.g., through a barrier 133 at right of the chamber 109 in FIG. 1). The barrier may correspond to a membrane configured to prevent passage of ferrofluid through the inlet and/or the outlet, for example.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A liquid-cooled computing system, the system comprising:

a processor having at least a first zone and a second zone, the processor in a first mode having a higher heat load in the first zone than in the second zone, the processor in a second mode having a higher heat load in the second zone than in the first zone;

a cooling plate assembly positioned over the processor and configured for dissipating heat from the processor, the cooling plate assembly comprising a body defining a coolant chamber having a coolant inlet and a coolant outlet, the cooling chamber configured for a flow of a coolant from the coolant inlet to the coolant outlet;

an amount of a ferrofluid within the coolant chamber and arrangeable in at least a first arrangement and a second arrangement, the ferrofluid in the first arrangement arranged to form a first set of walls defining a first set of coolant flow paths through the coolant chamber that facilitate a greater amount of the flow of the coolant along the first zone of the processor than along the second zone of the processor, and the ferrofluid in the second arrangement arranged to form a different, second set of walls defining a different, second set of coolant flow paths through the coolant chamber that facilitate a greater amount of the flow of the coolant along the second zone of the processor than along the first zone of the processor; and a magnet set comprising one or more electromagnets coupled with the body, the magnet set operable to alter placement of the ferrofluid within the coolant chamber to shift between the first arrangement and the second arrangement so as to arrange the ferrofluid in the first arrangement to facilitate the greater amount of the flow of the coolant along the first zone of the processor when the processor is in the first mode having the higher heat load in the first zone and so as to arrange the ferrofluid in the second arrangement to facilitate the greater amount of the flow of the coolant along the second zone of the processor when the processor is in the second mode having the higher heat load in the second zone, wherein the ferrofluid is configured to be immiscible with the coolant.

2. The system of claim 1, further comprising a barrier including a membrane positioned to contain the ferrofluid within the coolant chamber and prevent passage of the ferrofluid through the coolant outlet.

3. The system of claim 1, further comprising a set of fixed anchors fixed in a predetermined plan within the coolant chamber and configured to receive the ferrofluid such that the fixed anchors and the ferrofluid together define coolant flow path boundaries within the coolant chamber.

4. The system of claim 1, wherein the magnet set includes electromagnets positioned on differing sides of the coolant chamber to enable interaction among differing magnetic fields to control arrangement of the ferrofluid.

5. A system, comprising:

a cooling plate comprising a body defining a coolant chamber having a coolant inlet and a coolant outlet, the cooling chamber configured for a flow of a coolant from the coolant inlet to the coolant outlet, the cooling plate configured for dissipating heat from a heat-generating component operable in (i) a first mode having a higher heat load in a first zone than in a second zone of the heat-generating component and (ii) a second mode having a higher heat load in the second zone than in the first zone of the heat-generating component;

an amount of a ferrofluid within the coolant chamber and arrangeable to at least partially define one or more guides for the flow of the coolant within the coolant chamber between the coolant inlet and the coolant outlet, wherein the amount of the ferrofluid within the coolant chamber is arrangeable in at least a first arrangement and a second arrangement, the ferrofluid in the first arrangement arranged to form a first set of walls defining a first set of coolant flow paths through the coolant chamber that facilitate a greater amount of the flow of the coolant along the first zone of the heat-generating component than along the second zone of the heat-generating component, and the ferrofluid in the second arrangement arranged to form a different, second set of walls defining a different, second set of coolant flow paths through the coolant chamber that facilitate a greater amount of the flow of the coolant along the second zone of the heat-generating component than along the first zone of the heat-generating component; and a magnetic field emitter positioned relative to the body so as to be operable to alter placement of the ferrofluid within the coolant chamber to adjust a physical characteristic of at least one of the one or more guides within the coolant chamber between the coolant inlet and the coolant outlet, wherein the magnetic field emitter is operable to alter placement of the ferrofluid within the coolant chamber to shift between the first arrangement and the second arrangement of the ferrofluid so as to arrange the ferrofluid in the first arrangement to facilitate the greater amount of the flow of the coolant along the first zone of the heat-generating component when the heat-generating component is in the first mode having the higher heat load in the first zone and so as to arrange the ferrofluid in the second arrangement to facilitate the greater amount of the flow of the coolant along the second zone of the heat-generating component when the heat-generating component is in the second mode having the higher heat load in the second zone, wherein the ferrofluid is configured to not mix with the coolant.

6. The system of claim 5, wherein the physical characteristic comprises at least one of a shape, size, or location of the at least one of the one or more guides.

7. The system of claim 5, wherein the magnetic field emitter is operable to arrange the ferrofluid so that the at least one of the one or more guides defines a curved or non-straight shape.

8. The system of claim 5, wherein the coolant inlet of the coolant chamber is configured to be coupled with a coolant supply configured to supply the coolant in a form that is immiscible with a carrier substance of the ferrofluid.

9. The system of claim 5, wherein the magnetic field emitter is operable to arrange the ferrofluid so as to block the flow of the coolant through at least one channel within the coolant chamber.

10. The system of claim 5, further comprising a ferrofluid supply system operable to alter how much of the ferrofluid is in the coolant chamber by moving at least some of the ferrofluid between a reservoir and the coolant chamber.

11. The system of claim 5, further comprising the heat-generating component.

12. The system of claim 11, wherein the heat-generating component comprises a processor wherein the cooling plate comprises a cooling plate assembly positioned over the processor and configured for dissipating the heat from the processor;

and wherein the magnetic field emitter is included in a magnet set that comprises one or more electromagnets coupled with the body.

13. A method comprising:

applying a magnetic field to a coolant chamber of a cooling plate, the cooling chamber configured for a flow of a coolant therethrough; and altering a coolant flow path in the coolant chamber by adjusting an arrangement of a ferrofluid within the coolant chamber using the magnetic field, wherein altering the coolant flow path comprises at least shifting between a first arrangement and a second arrangement of the ferrofluid so as to arrange the ferrofluid in the first arrangement to facilitate a greater amount of the flow of the coolant along a first zone of a heat-generating component when the heat-generating component is in a first mode having a higher heat load in the first zone than in a second zone of the heat-generating component and so as to arrange the ferrofluid in the second arrangement to facilitate a greater amount of the flow of the coolant along the second zone of the heat-generating component when the heat-generating component is in a second mode having a higher heat load in the second zone than in the first zone, wherein the ferrofluid is configured to not mix with the coolant.

14. The method of claim 13, wherein the altering the coolant flow path comprises changing a shape of the coolant flow path.

15. The method of claim 13, wherein the altering the coolant flow path comprises changing a location of the coolant flow path.

16. The method of claim 13, wherein the altering the coolant flow path comprises changing a size of the coolant flow path.

17. The method of claim 13, wherein the altering the coolant flow path comprises closing or blocking the coolant flow path.

18. The method of claim 13, wherein the altering the coolant flow path comprises opening or unblocking the coolant flow path.

19. The method of claim 13, wherein the magnetic field is a first magnetic field;

wherein the altering the coolant flow path in the coolant chamber comprises adjusting the ferrofluid within the coolant chamber into the first arrangement of the ferrofluid in the coolant chamber in response to the first magnetic field to define a first flow path layout within the coolant chamber; and wherein the method further comprises:

applying a second magnetic field to the coolant chamber of the cooling plate; and adjusting the ferrofluid within the coolant chamber into the second arrangement of the ferrofluid in the coolant chamber using the second magnetic field to define a second flow path layout within the coolant chamber.

20. The method of claim 13, wherein prior to the applying the magnetic field, the method comprises:

receiving an amount of the ferrofluid through an introduction port into the coolant chamber;

permitting air to escape from the coolant chamber through an air escape port in response to the receiving of the amount of the ferrofluid through the introduction port; and sealing the introduction port and the air escape port.

* * * * *